United States Patent [19]

Zimmermann

[11] Patent Number: 4,629,880

[45] Date of Patent: Dec. 16, 1986

[54] GATE BIAS GENERATING CIRCUIT FOR FIELD EFFECT TRANSISTORS

[75] Inventor: Walter Zimmermann, Dorfen, Fed. Rep. of Germany

[73] Assignee: Siemens Aktiengesellschaft, Berlin and Munich, Fed. Rep. of Germany

[21] Appl. No.: 591,307

[22] Filed: Mar. 19, 1984

[30] Foreign Application Priority Data

Mar. 29, 1983 [DE] Fed. Rep. of Germany ....... 3311489

[51] Int. Cl.$^4$ ............................................. G01J 1/32
[52] U.S. Cl. ..................................... 250/205; 250/551
[58] Field of Search ........... 250/201, 205, 551, 214 R, 250/206; 307/311

[56] References Cited

U.S. PATENT DOCUMENTS

| | | | |
|---|---|---|---|
| 3,878,406 | 4/1975 | Beneking | 307/311 |
| 4,307,298 | 12/1981 | El Hamamsy et al. | 250/551 |
| 4,323,799 | 4/1982 | King et al. | 307/311 |
| 4,390,790 | 6/1983 | Rodriguez | 307/311 |
| 4,395,637 | 7/1983 | El Hamamsy | 250/551 |
| 4,408,131 | 10/1983 | Fox | 307/311 |

*Primary Examiner*—David C. Nelms
*Attorney, Agent, or Firm*—Thomas H. Jackson

[57] ABSTRACT

A circuit for generating a gate bias for field effect transistors in which one or several field effect transistor(s), identical within certain tolerances are paralleled and have a channel current above a predetermined value, is (are) connected to one or more electrically operated light sources so that at least a part of the channel current operates the light sources which radiate light. The light is received in a photocell and is converted to a dc voltage fed directly or indirectly to the gate(s) of the field effect transistor(s) in such a manner that the gate voltage thus supplied counteracts the channel current, and that an electrical device for the adjustment of the channel current is provided. The device described is especially well suited for application in microwave technology.

20 Claims, 1 Drawing Figure

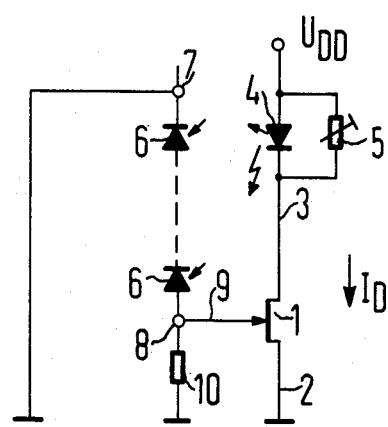

GATE BIAS GENERATING CIRCUIT FOR FIELD EFFECT TRANSISTORS

BACKGROUND OF THE INVENTION

This invention is related to a circuit for generating a gate bias for field effect transistors.

Field effect transistors require, in addition to an operating voltage applied between source and drain, another voltage which is applied between gate and substrate or between gate and channel or between gate and source or drain. For example, field effect transistors of the depletion type are usually constructed so that, besides an operating voltage which is applied between their source and drain, a voltage of opposite polarity to the operating voltage is applied between their gate and source. Thus, in such n-channel field effect transistors, a negative gate bias is needed besides a positive operating voltage. Such a negative gate bias may be supplied, for instance, via an additional external voltage source. Apart from an added cost, external voltage sources are not practical for various applications.

Another possibility is to generate from the given operating voltage a negative gate bias by charging energy storing elements by means of voltage transformers. Such generation of the gate bias is costly and therefore disadvantageous.

A negative gate bias can also be obtained by raising the source potential above ground, in consequence of which the source electrode has to be blocked against the reference ground high-frequency-effects with a capacitor. But the impedance situation for the high-frequency source grounding is altered considerably by the insertion of a capacitor, so that an unacceptable gate bias is generated for field effect transistors operating in a frequency range of about 3 to 5 GHz, such as gallium arsenide field effect transistors.

In many cases, direct source grounding is indispensable in microwave engineering so that a second, negative operating voltage to adjust the drain current becomes necessary. Adjusting or regulating the drain current as a function of the gate bias is of importance in field effect transistors in view of the requirement that the operating point of the field effect transistor is adequately controllable.

SUMMARY OF THE INVENTION

It is an object of the present invention to disclose a circuit for generating a gate bias for field effect transistors which generates from a given operating voltage another voltage, isolated dc-wise or coupled dc-wise outside the given operating voltage range and serving to generate the gate bias and/or adjust or control the channel current of field effect transistors.

The foregoing objects and others are achieved through a circuit for generating a gate bias for at least one field effect transistor (FET), or transistors which are identical within certain tolerances and which are paralleled and have a channel current above a predetermined value and which include:

(a) at least one electrically operated light source connected to the transistors so that at least part of the channel current operates the light sources, which emit or radiate light energy;

(b) at least one photocell for receiving the light energy and for generating a dc voltage which is fed to the gates of the FETs in such a manner that the gate voltage counteracts the channel current; and (c) an electrical device for adjusting the channel current.

Other features and advantages of the invention will be apparent from the following description of the preferred embodiments, and from the claims.

For a full understanding of the present invention, reference should now be made to the following detailed description of the preferred embodiments of the invention and to the accompanying drawings.

BRIEF DESCRIPTION OF THE DRAWING

The FIGURE shows a preferred embodiment of a circuit for generating the gate bias.

DETAILED DESCRIPTION

The FIGURE shows the basic design of an embodiment of the device according to the invention. The FIGURE depicts a field effect transistor 1 whose source 2 is grounded and whose drain 3 is connected to the cathode of a LED (light-emitting diode) 4, while the anode of LED 4 is connected to the operating voltage of the field effect transistor, the drain voltage $U_{DD}$. In parallel to the LED 4 is a potentiometer 5 for setting the operating point of the channel current $I_D$. When a drain current $I_D$ flows through the field effect transistor 1, at least a part of this current flows also through the LED 4. If the current through the LED 4 is sufficiently high, the LED will emit a light which is received by one or more, in particular six, suitably arranged photovoltaic cells 6. The light will be transformed into a photoelectric voltage. Instead of one LED, several parallel or series connected LEDs or other appropriately wired electrical light sources may also be used. In the presence of several photovoltaic cells 6, the cells are connected in series. To one free contact 7 of the series connected photo-voltaic cell 6 is applied a higher potential whereas the other free contact 8 of the series connected photo-voltaic 6 carries a lower potential. For the control of the drain current of a field effect transistor which is operated with a negative gate bias the contact 7 is grounded and the contact 8 connected to the gate 9 of the field effect transistor on the other end of an ohmic resistor 10 is grounded. Since the negative gate bias counteracts the drain current which originated it, this circuit effects a drain control. The result of a saturation of the drain current is that the light energy emitted by the LED increases. In turn, this greater radiation energy generates in the photo-voltaic cells a greater photoelectric voltage, bringing about a stronger negative gate bias which chokes the drain current flowing through the transistor 1 to a greater extent. With a device as depicted in the drawing a gate bias is generated from one single voltage source, and at the same time a genuine control of the drain current is achieved.

The device according to the invention can be used to advantage for the generation of a gate bias for gallium arsenide field effect transistors. Usually, this requires gate bias control currents of less than 10 uA, in particular less than 1 uA. Furthermore, the device according to the invention can be used for the dc-wise isolated signal control in power MOS transistors.

In various applications, LEDs and photocells may be combined in the form of opto couplers. Then up to 6 photocells are used for the signal control of power MOS transistors, because the gate bias needed is $-1$ V to $-2.5$ V.

As suggested in the summary of the invention section, a plurality of field effect transistors may be so controlled. The field effect transistors, being identical within certain tolerances including their requiring a channel current above a predetermined value, may all be connected in parallel.

Basically, the device according to the invention can be used for the gate bias generation in all field effect transistors which develop a drain current when a drain voltage is supplied, regardless of whether this drain current always flows in the field effect transistor at a zero V gate voltage or whether this drain current is specifically generated in an otherwise currentless field effect transistor by a suitable series electronics. Basically, both negative and positive gate biases can be generated with the device according to the invention. The description above deals with the case of negative bias generation. For the case of a positive gate bias generation the free contacts 7 and 8 of the series connected photocells 6 must be exchanged.

The device according to the invention is particularly suited for microwave technology applications.

There has thus been shown and described a novel gate bias generating circuit which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A circuit for generating a gate bias voltage, a source current and a drain current, and hence, an operating point, for at least one field effect transistor (FET), which requires a channel current above a predetermined value, the circuit comprising:
   (a) at least one electrically operated light source connected in series with said at least one transistor so that at least a part of said channel current flows through said light source, said light source radiating light energy when the part of said channel current flowing through said light source exceeds a predetermined threshold;
   (b) a least one photocell connected to the gate of the at least one transistor, for receiving said light energy and for generating a dc voltage in response thereto, said voltage applied to the gate of said at least one FET in such a manner that the applied gate voltage counteracts said channel current; and
   (c) an electrical device connected in parallel with said at least one electrically operated light source for the adjustment of the channel current and the part of said channel current flowing through said light source.

2. The circuit according to claim 1, wherein said electrical device for the adjustment of the channel current comprises a potentiometer.

3. The circuit according to claim 1, wherein said at least one light source comprises a light emitting diode (LED).

4. The circuit according to claim 2, wherein said at least one light source comprises a light emitting diode (LED).

5. The circuit according to claim 1, wherein said at least one photocell comprises up to six photocells connected in series, the end photocell of the up to six series connected photocells being the photocell connected to the gate of the at least one field effect transistor.

6. The circuit according to claim 2, wherein said at least one photocell comprises up to six photocells connected in series, the end photocell of the up to six series connected photocells being the photocell connected to the gate of the at least one field effect transistor.

7. The circuit according to claim 3, wherein said at least one photocell comprises up to six photocells connected in series, the end photocell of the up to six series connected photocells being the photocell connected to the gate of the at least one field effect transistor.

8. The circuit according to claim 4, wherein said at least one photocell comprises up to six photocells connected in series, the end photocell of the up to six series connected photocells being the photocell connected to the gate of the at least one field effect transistor.

9. The circuit according to claim 3, characterized in that said light source and said photocells are combined in the form of optocouplers.

10. The circuit according to claim 4, characterized in that said light source and said photocells are combined in the form of optocouplers.

11. The circuit according to claim 5, characterized in that said light source and said photocells are combined in the form of optocouplers.

12. The circuit according to claim 6, characterized in that said light source and said photocells are combined in the form of optocouplers.

13. The circuit according to claim 7, characterized in that said light source and said photocells are combined in the form of optocouplers.

14. The circuit according to claim 8, characterized in that said light source and said photocells are combined in the form of optocouplers.

15. The circuit according to claim 1, wherein said FET comprises a gallium arsenide field effect transistor.

16. The circuit according to claim 2, wherein said FET comprises a gallium arsenide field effect transistor.

17. The circuit according to claim 3, wherein said FET comprises a gallium arenside field effect transistor.

18. The circuit according to claim 5, wherein said FET comprises a gallium arsenide field effect transistor.

19. The circuit according to claim 9, wherein said FET comprises a gallium arsenide field effect transistor.

20. A circuit according to claim 1 where there are provided at least two FETs connected in parallel and having substantially identical characteristics.

* * * * *